United States Patent
Mehrotra et al.

(10) Patent No.: US 10,607,880 B2
(45) Date of Patent: Mar. 31, 2020

(54) DIE WITH BURIED DOPED ISOLATION REGION

(71) Applicant: NXP USA, INC., Austin, TX (US)

(72) Inventors: Saumitra Raj Mehrotra, Scottsdale, AZ (US); Tanuj Saxena, Chandler, AZ (US); Ljubo Radic, Gilbert, AZ (US); Bernhard Grote, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/116,986

(22) Filed: Aug. 30, 2018

(65) Prior Publication Data
US 2020/0075393 A1 Mar. 5, 2020

(51) Int. Cl.
| | |
|---|---|
| H01L 29/06 | (2006.01) |
| H01L 21/761 | (2006.01) |
| H01L 21/265 | (2006.01) |
| H01L 21/78 | (2006.01) |
| H01L 21/762 | (2006.01) |

(52) U.S. Cl.
CPC ...... *H01L 21/761* (2013.01); *H01L 21/26533* (2013.01); *H01L 21/76224* (2013.01); *H01L 21/78* (2013.01)

(58) Field of Classification Search
CPC .................. H01L 29/0615; H01L 21/76237
USPC ............................................ 257/509; 357/50
See application file for complete search history.

(56) References Cited

U.S. PATENT DOCUMENTS

| | | | |
|---|---|---|---|
| 4,104,086 A | 8/1978 | Bondur et al. | |
| 7,772,673 B1 | 8/2010 | Yin et al. | |
| 8,193,563 B2 | 6/2012 | Gambino et al. | |
| 8,664,715 B2* | 3/2014 | Disney | H01L 29/7811 257/335 |
| 2009/0039460 A1* | 2/2009 | Moens | H01L 21/761 257/520 |

OTHER PUBLICATIONS

Charavel, R., "Next generation of Deep Trench Isolation for Smart Power technologies with 120 V high-voltage devices", Microelectronics Reliability 50. 1758-1762, 2010.

(Continued)

*Primary Examiner* — Mark V Prenty
(74) *Attorney, Agent, or Firm* — David G. Dolezal

(57) ABSTRACT

A continuous buried doped isolation region in a substrate of a die. The substrate includes an isolation ring structure surrounding a first area of the die. The continuous buried doped isolation region is of a net first conductivity type and is located in the first area. The continuous buried doped isolation region including a first portion having a net first conductivity type dopant concentration of at least a first level located in an interior region of the first area and extending to a sidewall of the isolation ring structure. The first portion does not extend to the sidewall of the isolation ring structure in a location of a corner area of the first area. The corner area is defined by the isolation ring structure. A second portion of the continuous buried doped isolation region in the corner area has a net first conductivity type dopant concentration of a second level that is lower than the first level. The die comprises a semiconductor device located in the first area and including components located in the substrate in the first area above the continuous buried doped isolation region.

9 Claims, 10 Drawing Sheets

(56) References Cited

OTHER PUBLICATIONS

Chil, M., "Advanced 300mm 130nm BCD technology from 5V to 85V with Deep-Trench Isolation", Proceedings of the 2016 28th International Symposium on Power Semiconductor Devices and ICs (ISPSD), Jun. 12-16, 2016.
Parthasarathy, V., "A 0.25um CMOS based 70V smart power technology with deep trench for high-voltage isolation", Electron Devices Meeting, IEEE 2002.
Rudolf, R., "Automotive 130 nm Smart-Power-Technology including embedded Flash Functionality", Proceedings of the 23rd international Symposium on Power Semiconductor Devices & IC's, May 23-26, 2011.

\* cited by examiner

DIE WITH BURIED DOPED ISOLATION REGION

BACKGROUND OF THE INVENTION

Field of the Invention

This invention relates in general to die with a buried doped isolation region.

Description of the Related Art

Semiconductor devices include components implemented in semiconductor material of a substrate of a die. Some die include a buried doped isolation region located in an area defined by an isolation ring structure to form a semiconductor tub for isolation of the semiconductor devices having components in the tub.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a semiconductor die includes a continuous buried doped isolation region of a net first conductivity type located in a substrate of a first area of the die. The first area is defined by and surrounded by a ring isolation structure in the substrate. The continuous buried doped isolation region includes a first part located in an interior area of the first area and at an edge side of the first area. The first portion has a net first conductivity type doping concentration of at least a first level. The continuous buried doped isolation region has a second portion located in a corner area of the first area. The second portion has a net first conductivity type doping concentration at a second level that is lower than the first level. In one embodiment, the reduced net first conductivity type doping concentration may aid in improving the breakdown voltage characteristics in the corner area.

Figure 1:
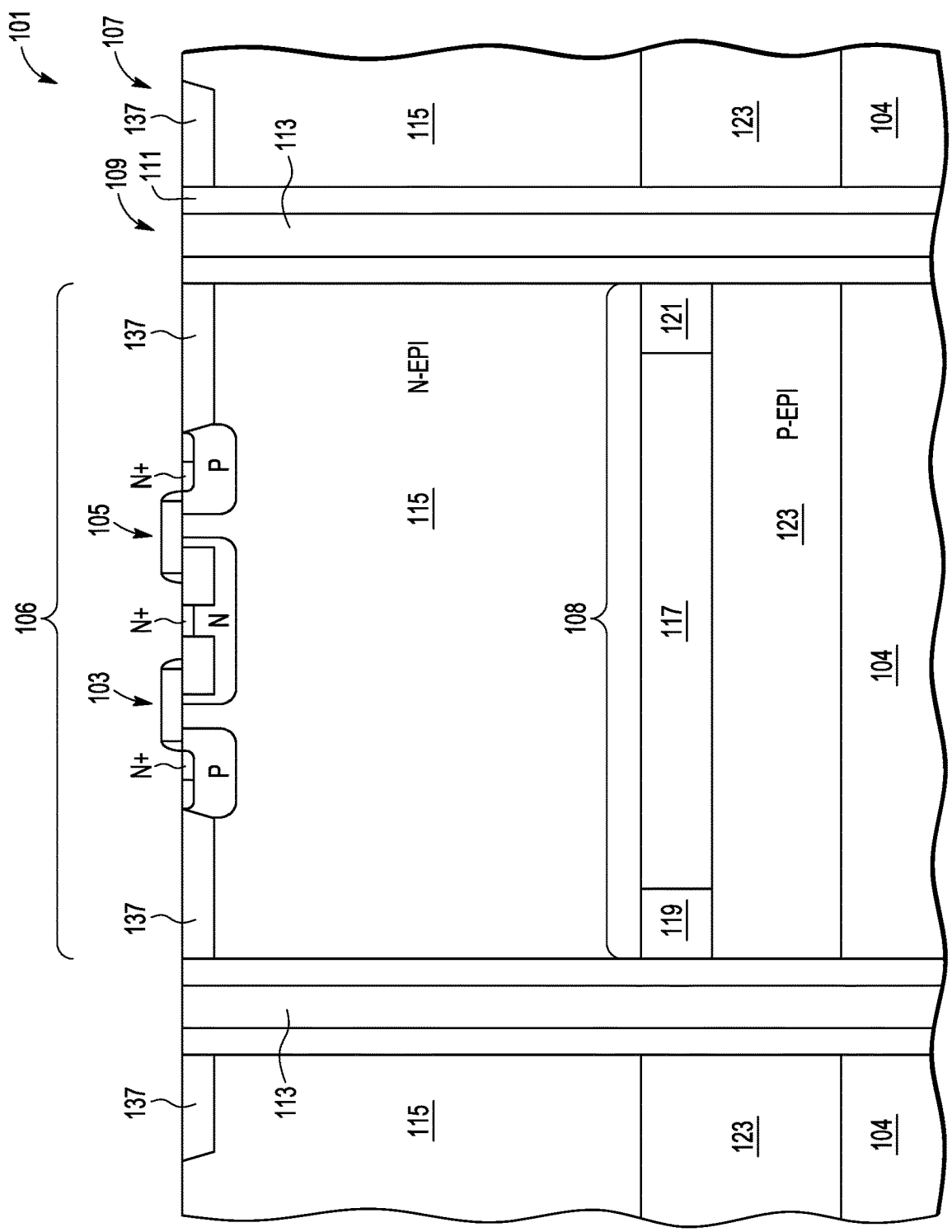
FIG. 1 is a partial cutaway side view of a wafer according to one embodiment of the present invention.

FIG. 1 is a partial cutaway side view of a wafer according to one embodiment of the present invention. Wafer 101 includes a substrate 107 which includes a substrate layer 104, an epitaxial layer 123, and an epitaxial layer 115. Epitaxial layers 123 and 115 are grown on wafer 101 by an epitaxial process. Layers 104, 123, and 115 are made of semiconductor materials (e.g. silicon, silicon germanium, silicon carbide, gallium nitride, a III-V semiconductor material). In the embodiment shown, epitaxial layers 123 and 115 have a net P-type conductivity in-situ doping when formed. Substrate 107 includes an isolation ring structure 109 that defines and surrounds an area 106 of wafer 101. In the embodiment shown, ring structure 109 includes a conductive material 113 (e.g. polysilicon) located in a dielectric material 111 (e.g. silicon oxide).

Located within area 106 in layer 115 are components of semiconductor devices (transistors 103 and 105). In the embodiment shown, the semiconductor devices are LDMOS transistors with the sources, drains, drift regions, isolation structures, and channel regions located in layer 115. In other embodiments, area 106 may include components for other types of semiconductor devices (e.g. other types of transistors, diodes, resistors etc.).

Located in area 106 is a continuous buried doped isolation region 108 which in the embodiment shown includes portions 119, 117, and 121. Continuous buried doped isolation region 108 acts with isolation ring structure 109 to form a semiconductor "tub" in which semiconductor devices located therein (transistors 103, 105) can be isolated (e.g. from an electrical and/or noise standpoint) from devices outside of the tub (not shown) during operation.

Portions 119 and 121 of region 108 are located in corner areas of area 106 (see FIG. 3) in layer 123. Portion 117 is located in an interior area of area 106 of layer 123. In the embodiment shown, region 108 has a net N-type doping concentration. Portions 119 and 121 have a lighter net N-type doping concentration than portion 117. This lighter net N-type doping concentration may allow for a reduction in the electric fields that develop at the corner areas of area 106 during operation of the devices in the tub. The locations of high electric fields are the locations of reduced breakdown voltage which reduce the breakdown voltage of the semiconductor devices. Accordingly, reducing the peak electric fields at these locations may raise the breakdown voltage of these areas.

As shown in FIG. 1, wafer 101 includes isolation structure 137 located at the top of substrate 107 in area 106. In the embodiment shown, devices (transistors 103 and 105) are separated from isolation ring structure 109 by isolation structures 137. In the embodiment shown, isolation structure 137 extends out from ring structure 109 by distance greater than the distance that portions 119 and 121 extend out from ring structure 109. In some embodiments, isolation structure 137 is a shallow trench isolation structure, and isolation structure 109 is a deep trench isolation structure.

The relative dimensions of the objects in FIG. 1 (and in subsequent Figures) are shown for purposes of illustration and may be different in other embodiments. For example, in FIG. 1, layer 115 is shown as thicker than layer 123.

However, in other embodiments, layer 123 would be thicker than layer 115. Also in other embodiments, the width of a ring segment of ring structure 109 may much thinner with respect the width of area 106 than what is shown in FIG. 1.

Figure 2:
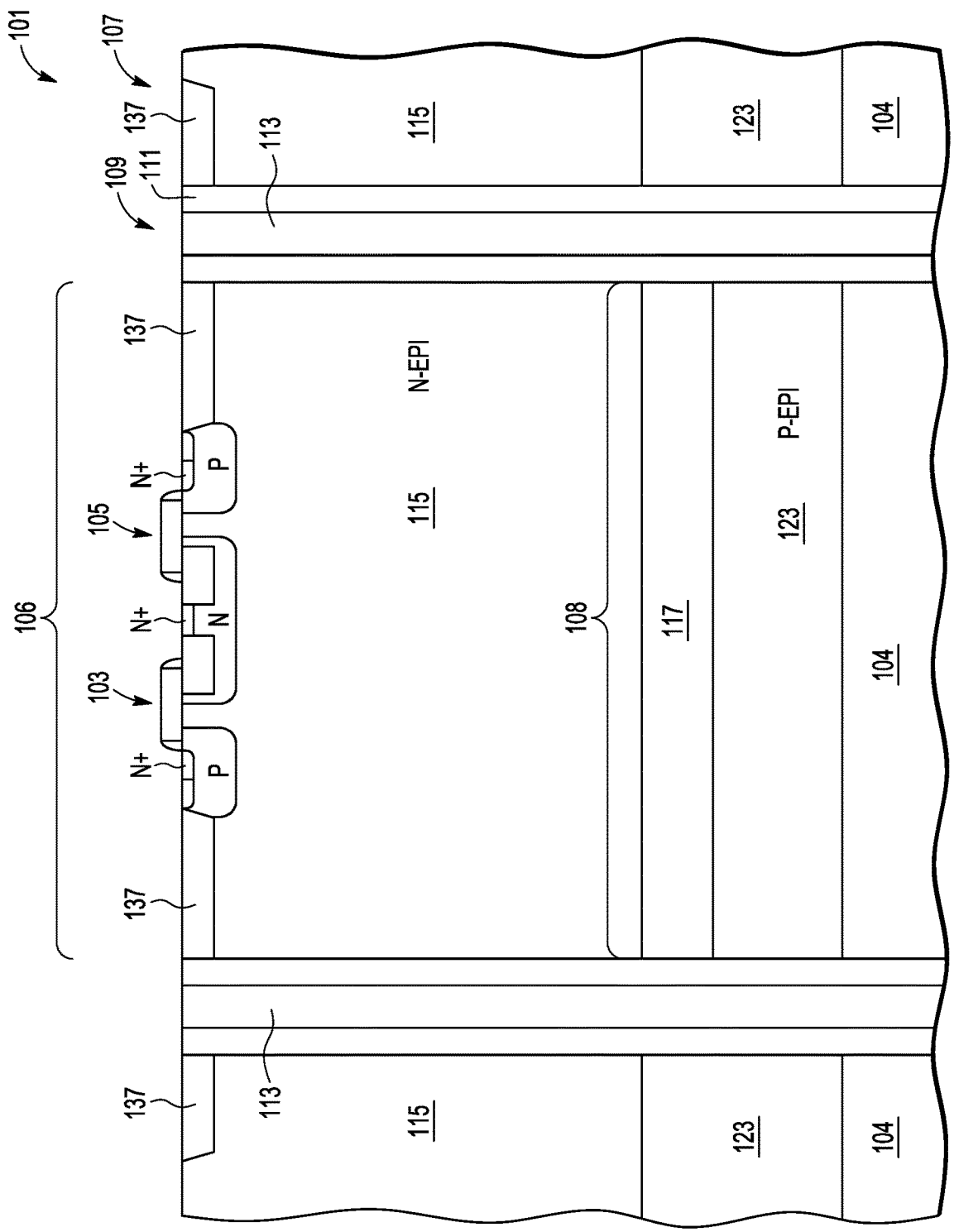
FIG. 2 is a second partial cutaway side view of a wafer according to one embodiment of the present invention.
Figure 3:
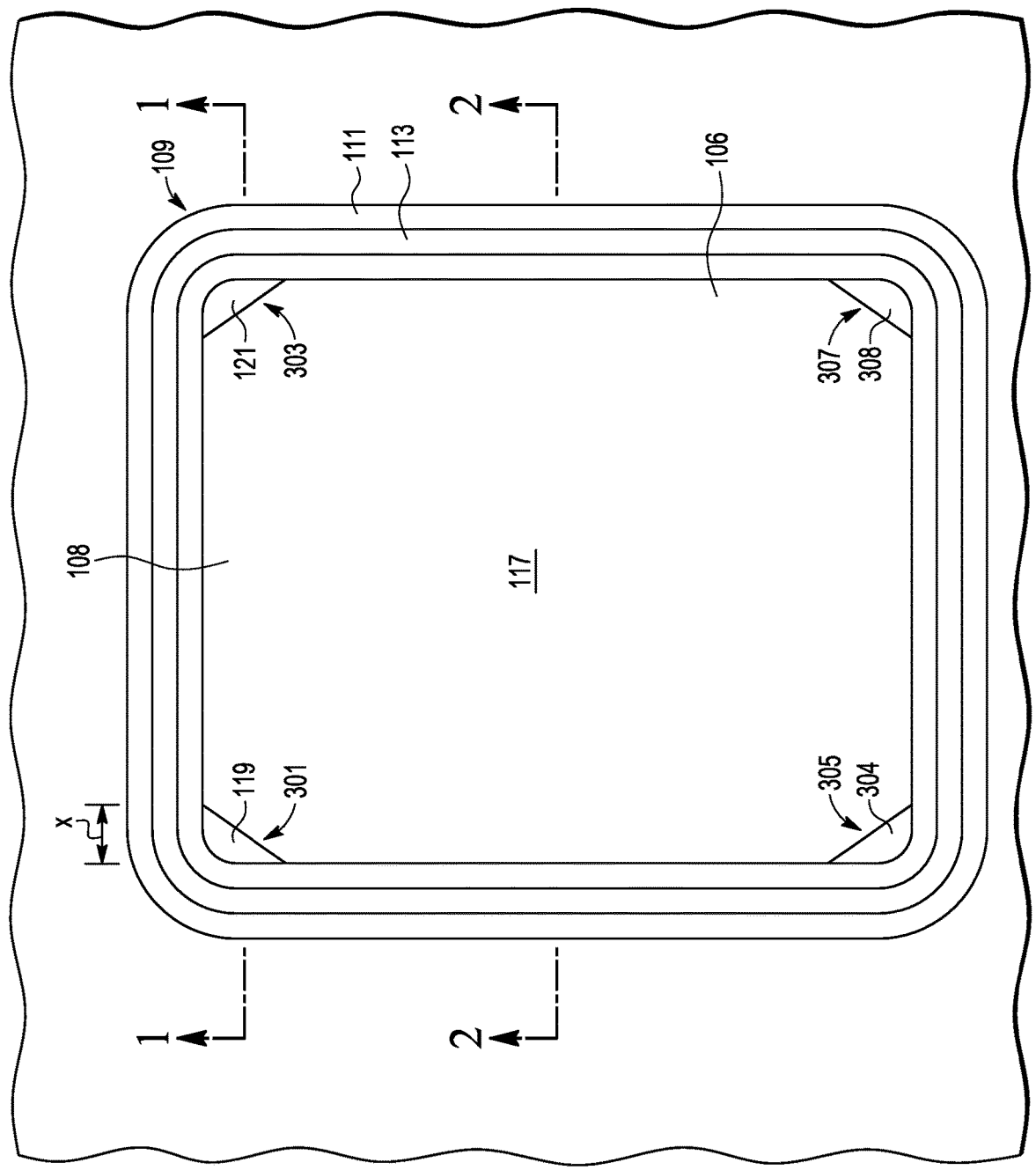
FIG. 3 is a partial cutaway top view of a wafer according to one embodiment of the present invention.

FIG. 2 is a partial cross-sectional view of wafer 101 at a different location than the cross-sectional view of FIG. 1. See FIG. 3 showing the locations of the views of FIGS. 1 and 2. The view of FIG. 2 is shown more towards the middle portion of area 106 and does not show the corner areas of area 106. At this location, portion 117 extends to the interior sidewalls of ring structure 109. Although in the embodiment shown, isolation structure 137 extends out the same distance from isolation ring structure 109 in the cross-sectional views of FIG. 1 and FIG. 2, in other embodiments, the edge of isolation structure 137 can be located closer to ring structure 109 in the cross section of FIG. 2 than with the cross section of FIG. 1 in that the cross section of FIG. 2 does not include portions 119 and 121. According, more semiconductor devices can be located in the cross section of FIG. 2 than in FIG. 1.

FIG. 3 is a partial cutaway top view of wafer 101 at a plane of the top of region 108. FIG. 3 shows area 106 defined by ring structure 109. As shown in FIG. 3, portions 119 and 121 of region 108 are located in corner areas 301 and 303, respectively. Region 108 also includes portions 304 and 308 located in corner areas 305 and 307 of area 106, respectively.

In the embodiment shown, area 106 as defined by ring structure 109 is of a rectangular shape with 90 degree rounded corners. However, in other embodiments, area 106 may have other shapes including a different number of corners and/or with corners of different angles.

Figure 4:
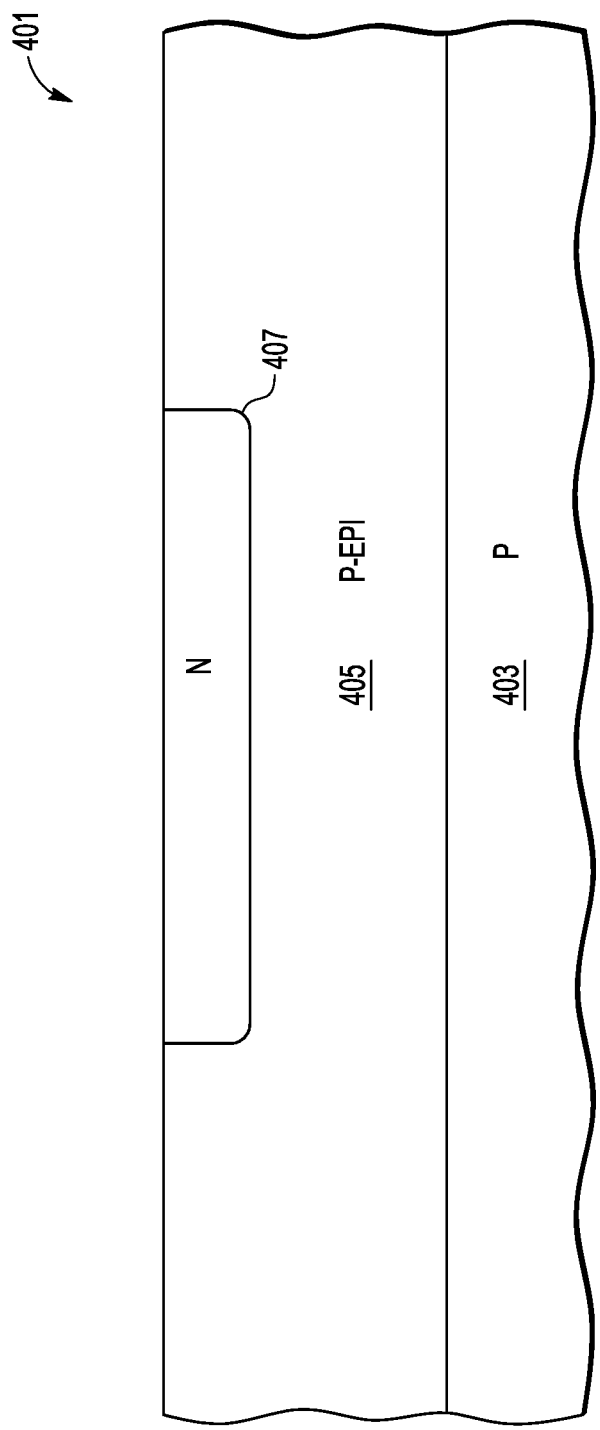
FIGS. 4-6 are partial cross-sectional side views of a wafer at various stages during the manufacture of a semiconductor device according to one embodiment of the present invention.
Figure 5:
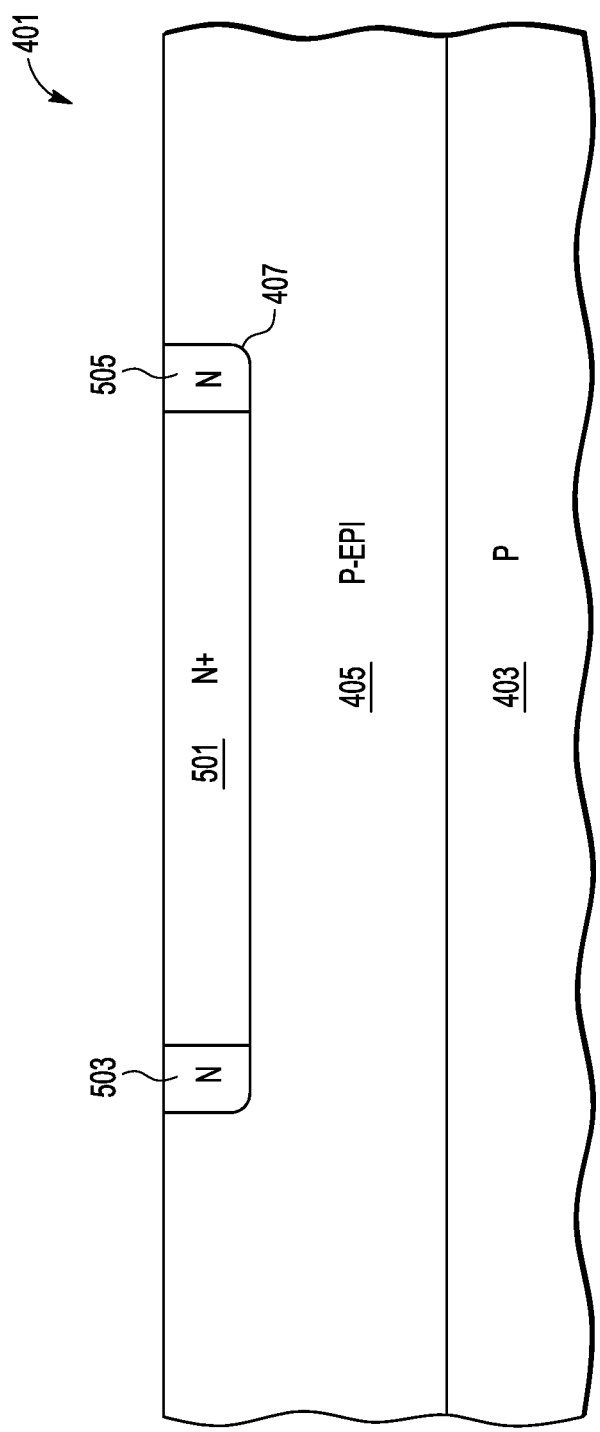
Figure 6:
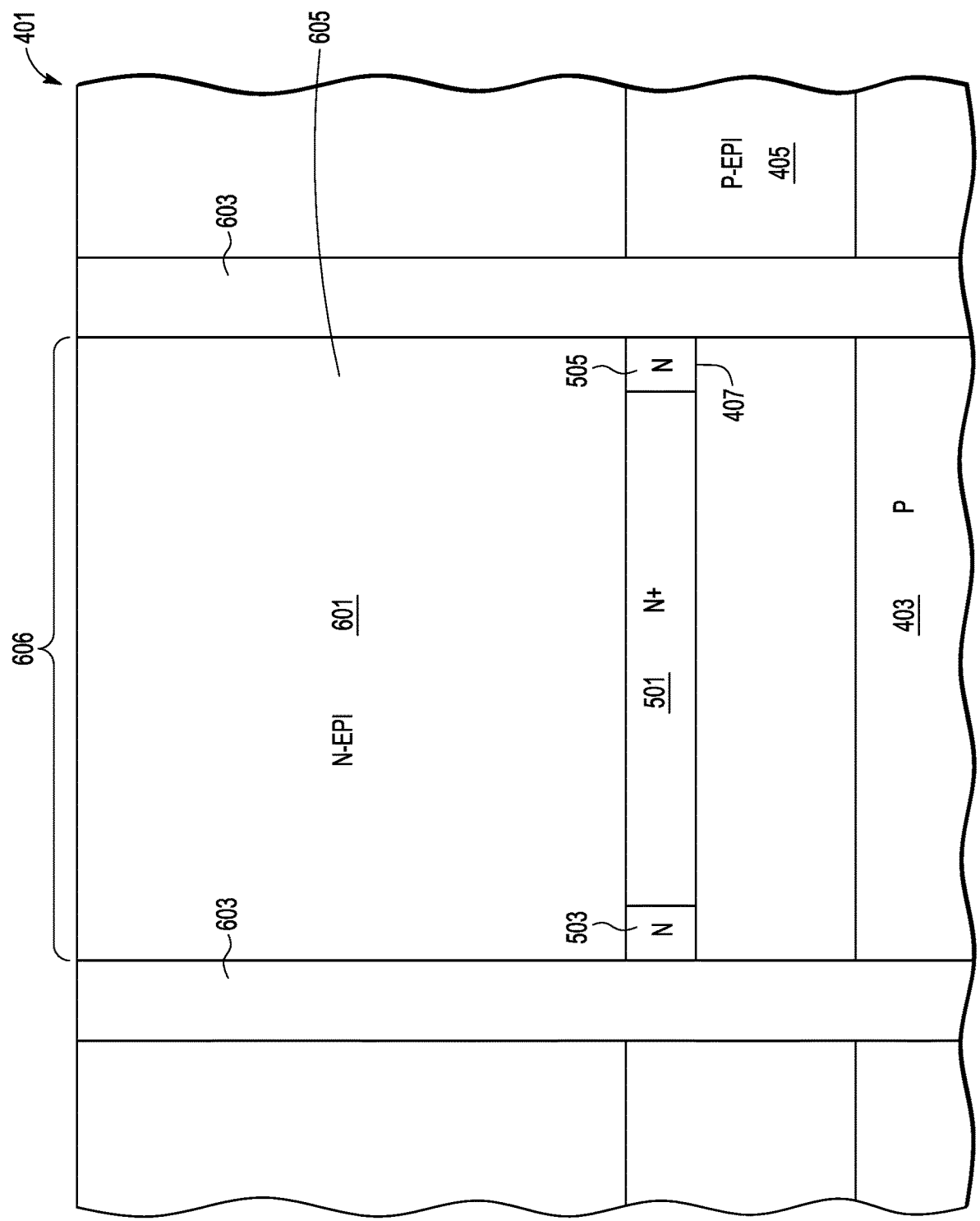

FIGS. 4-6 set forth various partial cross-sectional side views of wafer 401 during the manufacture of a die with a buried doped isolation region according to one embodiment of the present invention. In the embodiment shown, wafer 401 includes a substrate layer 403 and an epitaxial layer 405 epitaxially grown over layer 403. In one embodiment, layers 403 and 405 are each made of silicon. In the embodiment shown, layer 403 has a net P-type doping concentration in the range of $10^{14}$-$10^{19}$ cm$^{-3}$ and layer 405 has a net P-type doping concentration in the ranges of $10^{14}$-$10^{17}$ cm$^{-3}$, but these may be of other concentrations in other embodiments. In one embodiment, layer 405 has a thickness in the range of 3-10 um, but may be of other thicknesses in other embodiments.

Region 407 is formed by selectively implanting N type conductivity dopants (e.g. phosphorous, arsenic, antimony) into layer 405. In one embodiment, a patterned mask (not shown) is formed over wafer 401 wherein N-type dopant ions are selectively implanted through the openings into layer 405. In one embodiment, region 407 is formed by a phosphorus implant having a dosage in the range of $5 \times 10^{11}$ to $5 \times 10^{13}$ cm$^{-2}$ and at an energy in the range of 300-2000 Kev, but the dopants may be implanted at other dosages and other energies in other embodiments. In some embodiments, the implant to form region 407 may be a blanket implant into all areas of wafer 401. Also in other embodiments, wafer 401 may not include an epitaxial layer 405 wherein region 407 would be formed in substrate layer 403.

FIG. 5 shows the same partial cross-sectional view of wafer 401 after a second selective implant region 501 is formed in layer 405. The implant to form region 501 is at a higher dosage of N-type dopants. In one embodiment, the implant is made using antimony at a dosage in the range of $10^{13}$ to $10^{15}$ cm$^{-2}$ and at an energy in the range of 30-300 Kev, but may be at other dosages or other energies in other embodiments. In some embodiments, the dosage for implanting region 501 is at least 10 times greater than the dosage for implanting region 407. In other embodiments, the dosage for implanting region 501 may be greater than the dosage of implanting region 407 by a factor in the range of 10-100, but may be of other factors in other embodiments. In general, region 501 overlaps region 407 except for portions 503 and 505 of region 407 in the cross section of FIG. 5.

FIG. 6 shows the same partial cutaway side view of wafer 401 after an epitaxial semiconductor layer 601 (e.g. of silicon) is formed on layer 405. In one embodiment, layer 601 has a thickness in the range of 4-6 um, but may have other thicknesses in other embodiments. In one embodiment, layer 601 is in-situ doped with a P type dopant (e.g. Boron) in a concentration in the range of $10^{14}$-$10^{16}$ cm$^{-3}$, but may be doped at other concentrations in other embodiments.

After the formation of layer 601, ring isolation structure 603 is formed in wafer 401. In one embodiment, structure 603 is formed by forming a trench into wafer 401 to a specified depth. In one embodiment, the depth is 11 um, but may be of other depths in other embodiments. The trench is then filled with a dielectric material, a dielectric and conductive material (similar to structure 109), an air gap, or a combination thereof. In the embodiment shown, structure 603 defines an area 606 of wafer 401 in which is located a semiconductor tub 605.

The cutaway views of FIGS. 4, 5, and 6 are located at an edge area of a subsequently formed tub 605 (similar to the location of the view of FIG. 1). As such, portions 503 and 505 are located in corner areas of the tub 605. If the views of FIGS. 4, 5, and 6 did not include the corner areas of tub 605 (similar to the location of the view of FIG. 2), then regions 501 and 407 would completely overlap with each other in that region 501 extends to the sidewall of structure 603 in those locations.

Regions 501 and 407 form a buried doped isolation region for isolating the subsequently formed semiconductor devices (not shown) in tub 605. The location of region 501 is more heavily doped with N type dopants than portions 505 and 503 which are located in corner areas of area 606. Accordingly, tub 605 will have higher breakdown voltages at its corner areas than if those portions in the corner areas were more heavily doped.

Although in the embodiment shown, regions 501 and 407 are located in layer 405, in some embodiments, wafer 401 may be subjected to an anneal process where the dopants implanted into regions 501 and 407 diffuse into other areas including into layer 601. After such a diffusion, the net N-type concentration differences between region 501 and portions 503 and 507 may not be as sharply defined as when implanted. With some such embodiments, the net N-type doping concentration of the buried doped isolation layer along the sidewall in area 606 at a non-corner area will be at last 10 times greater (e.g. 10-100 times greater) than in a corner area, however, the doping concentration levels may be at other ratios in other embodiments.

In subsequent processes, semiconductor devices (e.g. transistors, diodes) will be formed in tub 605. Afterwards, interconnect layers will be formed on wafer 401 to connect the components of the semiconductor devices (not shown) in tub 605 with other semiconductor devices on wafer 401 and to external terminals (e.g. bond pads, posts—not shown). The wafer 401 is then singulated into multiple die with each die including at least one tub similar to tub 605. Afterwards, the die are packaged (e.g. in an encapsulant) where they can be implemented in an electronic system (e.g. computer, cell phone, appliance, automobile, etc.)

In other embodiments, a buried doped isolation region with a lower net conductivity type doping concentration level at the corner areas may be formed by other methods. For example, referring back to FIG. 5, in some embodiments, the lower dosage implant (the implant that formed region 407) would only be selectively made in the corner areas of area 606 (at the locations of portions 503 and 505 in FIG. 5). Also in other embodiments, referring to FIG. 4, a heavy N-type dopant implant would be selectively made in region 407 followed by a P-type counter doping in the corner areas (the location of portions 503 and 505 in FIG. 5). As a result of the counter doping with the P-type dopants, the corner areas have a lower net N-type conductivity doping concentration than the rest of region 407. In other embodiments, the heavy N-type dopant implant would be made to one depth and the light N-type dopant implant would be made to a different depth. For example, the heavily doped region may be located over the lightly doped region or vice versa.

In still other embodiments, the implants for forming the buried doped isolation region would be made deep into the substrate below the semiconductor tub. In some such embodiments, no epitaxial layer would be formed on wafer 401 after the implants for forming the buried doped isolation regions.

Figure 7:
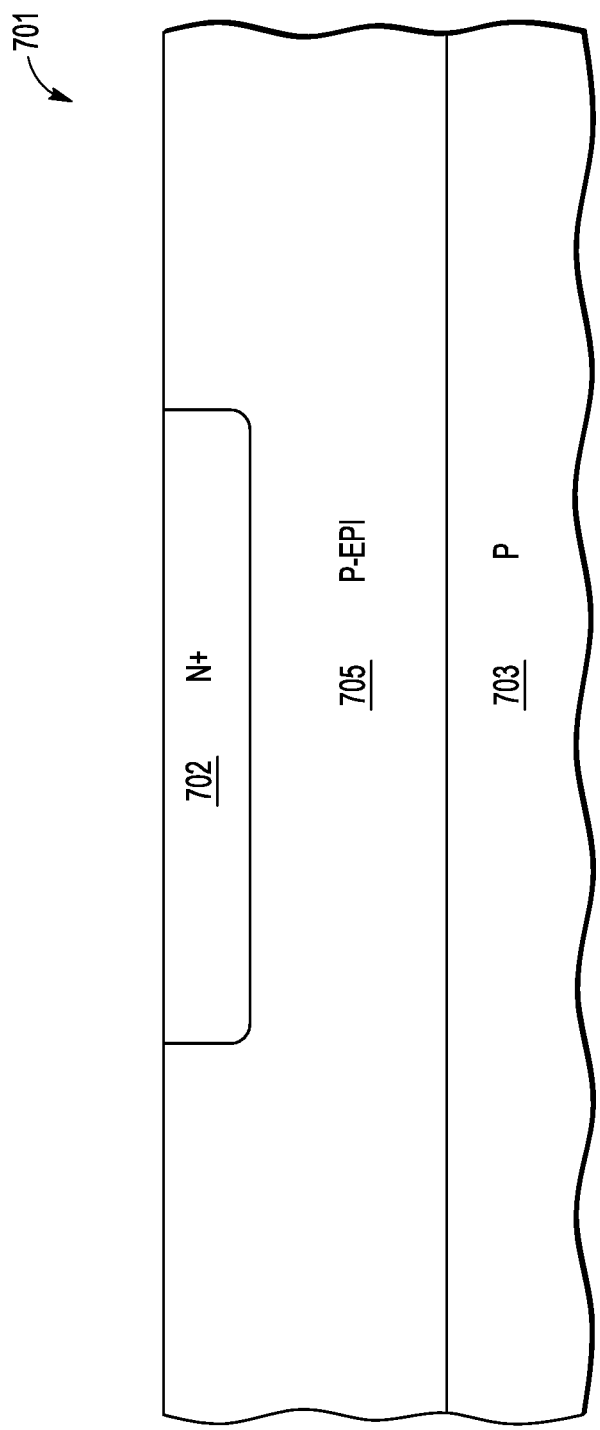
FIGS. 7-8 are partial cross-sectional side views of a wafer at various stages during the manufacture of a semiconductor device according to another embodiment of the present invention.
Figure 8:
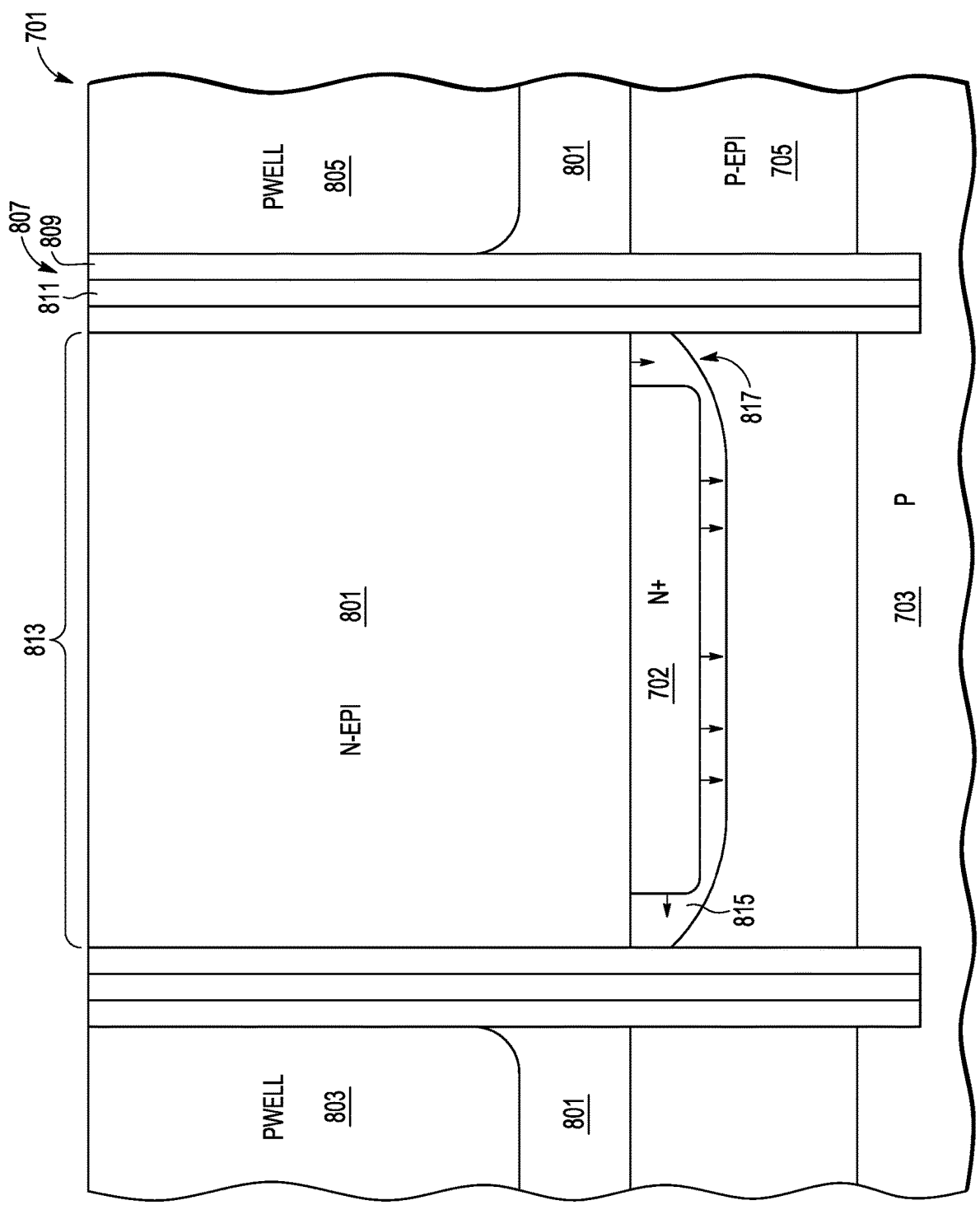

FIGS. 7 and 8 set forth various partial cross-sectional side views of wafer 701 during the manufacture of a die with a buried doped isolation region according to another embodiment of the present invention. Wafer 701 includes a semiconductor substrate layer 703 and an epitaxial P-type semiconductor layer 705 that is similar to layers 403 and 405, respectively, in some embodiments. Region 702 is implanted with N-type dopants at a similar dosage and at a similar energy to region 501 in some embodiments.

FIG. 8 shows the same view as FIG. 7 after an epitaxial semiconductor layer 801 is formed on wafer 701 and an isolation structure 807 is formed in wafer 701. In the embodiment shown, layer 801 is formed with an in-situ N-type dopant (e.g. phosphorous, arsenic, antimony) at a concentration in the range of $10^{14}$-$10^{17}$ cm$^{-3}$. After the formation of layer 801, a ring isolation structure 807 is formed in wafer 701 to define area 813. Ring structure 807 includes a conductive material 811 (e.g. polysilicon) with a dielectric material 809. The conductive material 811 contacts substrate layer 703 to bias substrate layer 703 during operation. Other portions of layer 801 outside of ring structure 807 are selectively implanted with P-type dopants (e.g. Boron) to form P-Wells 803 and 805. In one embodiment, other semiconductor devices will be formed in these wells which will be isolated by ring structure 807 from devices in area 813.

After the formation of layer 801, wafer 701 is subject to an annealing process where N-type dopants from layer 801 and region 702 diffuse into corner areas 815 and 817 below layer 801 to provide those areas with a lighter net N-type conductivity doping concentration than in region 702. In the areas of area 813 that are not in a corner area, region 702 extends to the sidewall of ring structure 807.

Figure 9:
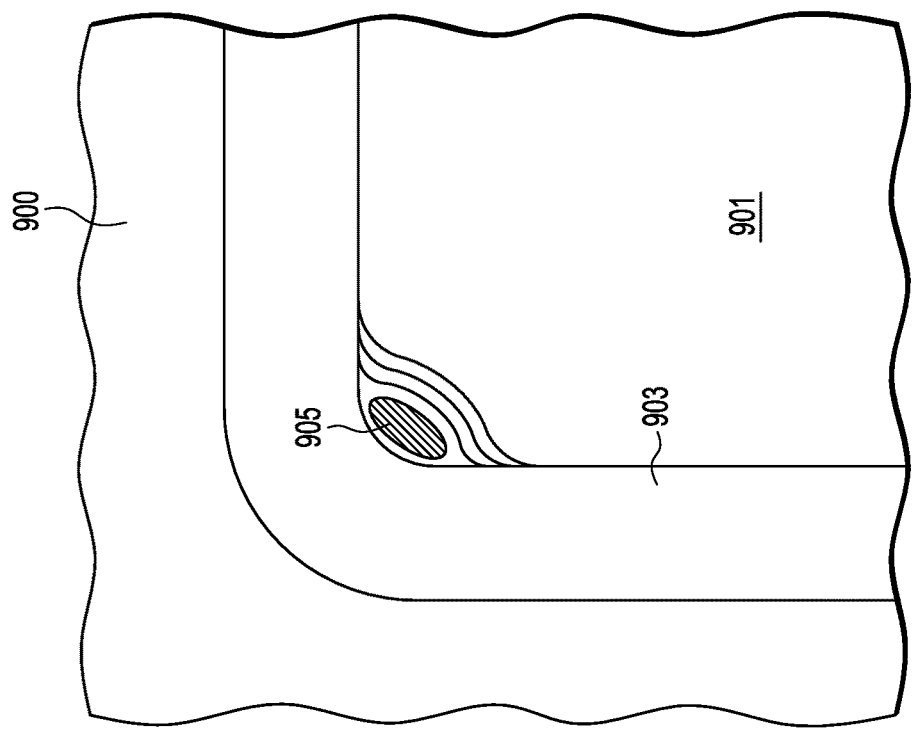
FIG. 9 is a partial cutaway top view of a prior art die illustrating impact ionization in a corner area during breakdown.

FIG. 9 is a partial cutaway top view of a prior art die 900 illustrating the impact ionization in a corner area of a semiconductor tub during operation. Die 900 includes an isolation ring structure 903 which surrounds an area 901 with semiconductor devices (not shown) located therein. A buried doped isolation region (not shown) with a homogenous doping level concentration is located in area 901 and extends to the sidewalls of structure 903 including in a corner region of area 901. During operation, high electric fields can occur at location 905. Because of these high electric fields, a lower break down voltage occurs at these locations.

Figure 10:
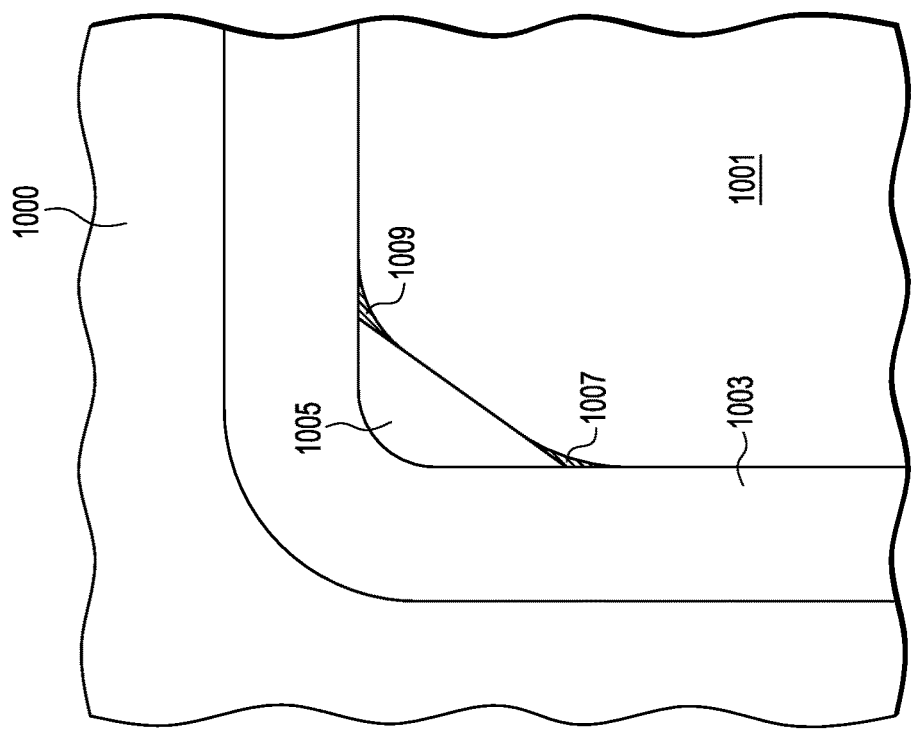
FIG. 10 is a partial cutaway top view of a die as per one embodiment of the present invention illustrating impact ionization in a corner area.

FIG. 10 is a partial cutaway top view of a die 1000 according to one embodiment of the present invention illustrating impact ionization in a corner area during operation. In the embodiment shown, die 1000 includes an isolation ring structure 1003 and a buried doped isolation region (not shown) located in area 1001. In the embodiment shown, the buried doped isolation region has a lighter N-type doping concentration in the corner area 1005 than in an interior area or along the sidewall of ring structure 1003 at non-corner areas of area 1001. Because corner area 1005 has a lighter net N-type doping concentration than the rest of area 1001, the peak electric field regions move out to locations 1007 and 1009 and the value of the peak electric field regions are reduced with respect to the die of FIG. 9. Accordingly, the breakdown voltage at the corner areas (1005) is higher than at the corner areas of die 900. In some embodiments, depending upon the difference in doping concentrations of the buried doped isolation region at the corner areas compared with the rest of the region and the size of the area of the reduced doping concentration in the corner area, the breakdown voltage can be increased up 50% percent.

Figure 11:
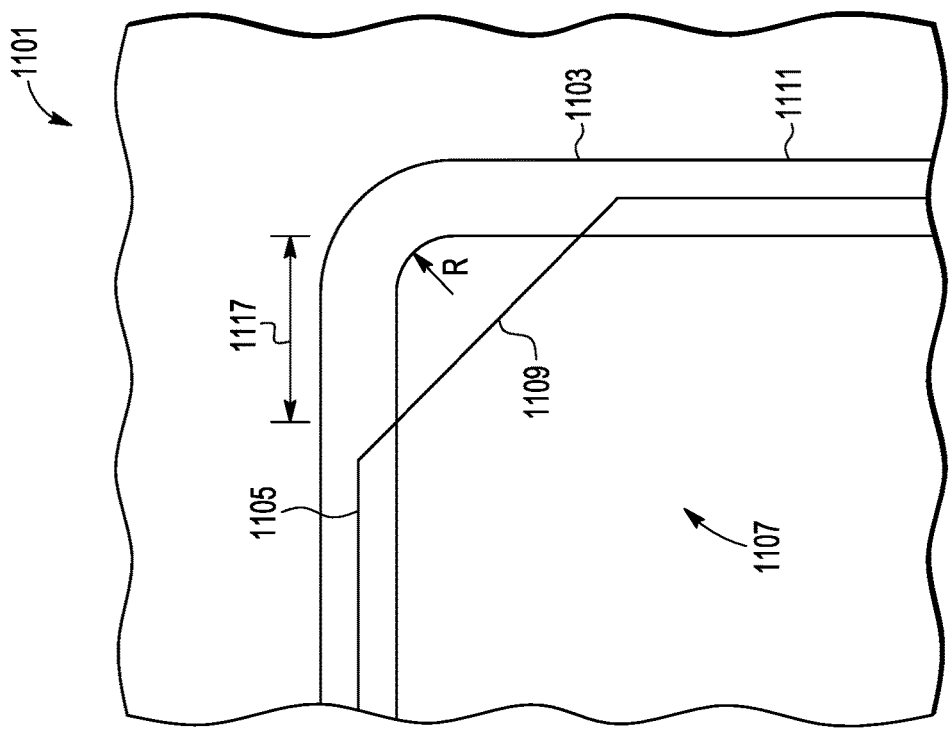
FIG. 11 is a partial cutaway top view of a wafer according to one embodiment of the present invention.

FIG. 11 is a partial cutaway top view of a wafer 1101 illustrating the extent of a mask opening 1105 for implanting the heavily doped portion of the buried doped isolation region (e.g. portion 117) into area 1107. In the embodiment shown, an isolation ring structure 1103 surrounds area 1107 which includes a semiconductor tub above a buried doped isolation region (not shown) in which semiconductor devices (not shown) are located. The corner of isolation ring structure 1103 is rounded with an interior radius ("R") shown in FIG. 11. The mask opening boundary 1105 has a chamfered edge 1109 at the corner shown in FIG. 11 that is relatively straight with respect to the straight edges (1111) of isolation ring structure 1103. The heavy implanted region of the buried doped isolation region is located to the lower left (relative to the view shown in FIG. 11) in area 1107 and extending past the interior portion of side edge 1111. As shown in FIG. 11, the chamfered edge 1109 provides a pullback 1117 of the heavily doped region from the interior straight portion sidewalls (1111) of ring structure 1103. The breakdown voltage can be adjusted by varying the amount of pullback 1117 with respect to the radius (R) of the ring structure corner. In one embodiment, the pullback 1117 can be in the range from 0-5 um, but may be at other values in other embodiments. In some embodiments, the radius R may be in the range from 0-5 um, but may be of other values in other embodiments. In one embodiment where the radius is 1.5 um, a pullback of approximately 3 um can achieve an approximate 16 percent increase in the breakdown voltage in the corner area.

Figure 12:
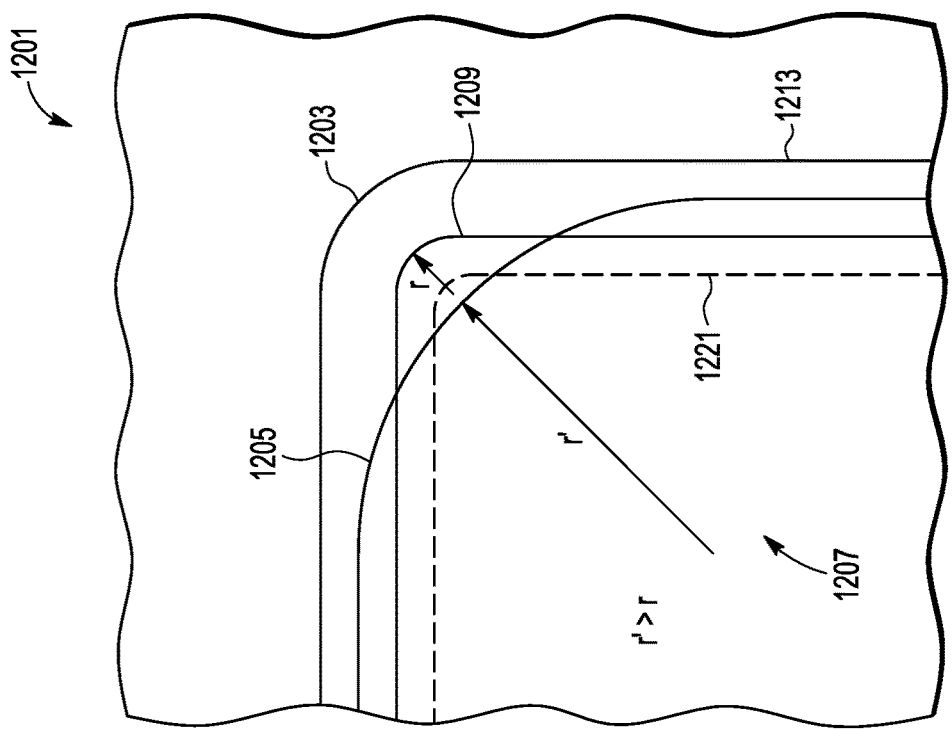
FIG. 12 is a partial cutaway top view of a wafer according to another embodiment of the present invention.

FIG. 12 is a is a partial cutaway top view of a wafer 1201 illustrating the extent of the mask opening edge 1205 for implanting the heavily doped portion of the buried doped isolation region (e.g. portion 117) into area 1207 according to another embodiment of the present invention. Area 1207 is surrounded by ring structure 1203. In the embodiment shown, the mask edge 1205 is curved at the corner area of area 1207 with respect to the straight edges (1213) of ring structure 1203. In the embodiment shown, the radius (R) of the interior wall of ring structure 1203 at a corner area is less than the radius (R') of the edge 1205 at the corner area. In one embodiment, R may be in the range of 0-5 um and R' may be in the range of 0-15 um, but these may be of other values in other embodiments. In one embodiment, R' is 2-10 times greater than R, but may be at other ratios in other in other embodiments.

FIG. 12 also shows "set off" line 1221 that defines a design rule on how close a semiconductor device can be placed adjacent to a side wall of a ring structure. As can be shown in FIG. 12, only a small area in the corner region is removed from use due to the set back of the heavily doped buried isolation region in area 1207. If the interior wall of ring structure were to be made bigger to reduce the corner areas of a ring structure (similar to edge 1205), more of area 1207 would be unusable for semiconductor devices than with embodiments where heavily doped buried isolation regions are set back from the corner areas.

Although the buried doped isolation region is described herein as have a net N-type concentration, in other embodiments, the buried doped isolation region may have a net P-type buried doped isolation region.

As disclosed herein, a first structure is "directly over" a second structure if the first structure is located over the second structure in a line having a direction that is perpendicular with the generally planar major side of the wafer. For example, in FIG. 1, transistor 103 is directly over portion 117. Transistor 103 is not directly over portion 121. As disclosed herein, a first structure is "directly beneath" a second structure if the first structure is located beneath the second structure in a line having a direction that is perpendicular with the generally planar major side of the wafer. For example, in FIG. 1, portion 117 is directly beneath transistor 105. Portion 119 is not directly beneath transistor 105. One structure is "directly between" two other structures in a line if the two structures are located on opposite sides of the one structure in the line. For example, in FIG. 1, portion 117 is located directly between structure portions 119 and 117 in a line in the cut away side view of FIG. 1. Portion 117 is not located directly between transistors 103 and 105 in a line. A first structure is "directly lateral" to a second structure if the first structure and second structure are located in a line having a direction that is parallel with a generally planar major side of the wafer. For example, portions 119 and 121 are directly lateral to each other. One structure is "directly laterally between" two other structures if the two structures are located on opposite sides of the one structure in a line that is parallel with a generally planar major side of the wafer. For example, in FIG. 1, portion 117 is located directly laterally between portions 119 and 121.

Features specifically shown or described with respect to one embodiment set forth herein may be implemented in other embodiments set forth herein.

In one embodiment, a die includes a substrate. The substrate includes an isolation ring structure surrounding a first area of the die and a continuous buried doped isolation region of a net first conductivity type located in the first area. The continuous buried doped isolation region including a first portion having a net first conductivity type dopant concentration of at least a first level located in an interior region of the first area and extending to a sidewall of the isolation ring structure. The first portion does not extend to the sidewall of the isolation ring structure in a location of a corner area of the first area. The corner area is defined by the isolation ring structure. A second portion of the continuous buried doped isolation region in the corner area has a net first conductivity type dopant concentration of a second level that is lower than the first level. The die comprises a semiconductor device located in the first area and including components located in the substrate in the first area above the continuous buried doped isolation region.

Another embodiment includes a method of forming a semiconductor device. The method includes implanting first conductivity type dopants into a first region of a first area of a wafer. The first region including a portion located in a plane of the wafer. The first area including a first corner area and at least one edge side not in a corner area of the first area. The first region is located at an edge side of the at least one edge side and in an interior area of the first area but is not located in the first corner area. The method includes forming a ring isolation structure in the wafer. The ring isolation structure defining the first area. The ring isolation structure extends into the wafer at least to a depth of the first region. The method includes forming components of a semiconductor device in the wafer in the first area above the first region and after forming the components, singulating the wafer into a die. The die includes the semiconductor device. After the singulation, the first region at the edge side in the plane has a net first conductivity type dopant concentration of a first level and the first corner area in the plane has a net first conductivity type dopant concentration of a second level that is less than the first level.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A die comprising:
   a substrate comprising:
      an isolation ring structure surrounding a first area of the die;
      a continuous buried doped isolation region of a net first conductivity type located in the first area, the continuous buried doped isolation region including a first portion having a net first conductivity type dopant concentration of at least a first level located in an interior region of the first area and extending to a sidewall of the isolation ring structure, wherein the first portion does not extend to the sidewall of the isolation ring structure in a location of a corner area of the first area, the corner area being defined by the isolation ring structure;
      wherein a second portion of the continuous buried doped isolation region in the corner area has a net first conductivity type dopant concentration of a second level that is lower than the first level;
   a semiconductor device located in the first area and including components located in the substrate in the first area above the continuous buried doped isolation region.

2. The die of claim 1 further wherein the second level is lower than the first level by at least a factor of 10.

3. The die of claim 1 wherein the first portion includes a region that was implanted with the first conductivity type dopant during an implant operation, wherein the second portion was not implanted with the first conductivity type dopant during the implant operation.

4. The die of claim 3 wherein the first portion and the second portion each include a region that was implanted with the first conductivity type dopant during a second implant operation, wherein a dosage of the first conductivity type dopant of the implant operation is greater than a dosage of the first conductivity type dopant of the second implant operation.

5. The die of claim 4 wherein the dosage of the implant operation is at least 10 times greater than the dosage of the second implant operation.

6. The die of claim 1 wherein:
The continuous buried doped isolation region is at least partially located in a first layer of the substrate, wherein the components of the semiconductor device are located in a second layer located over the first layer, the second layer being an epitaxial layer.

7. The die of claim 6 wherein the first portion includes a region that was implanted with the first conductivity type dopants during an implant operation, the first region is located in the first layer and not in the second layer.

8. The die of claim 1 wherein the isolation ring structure extends into the substrate to a greater depth than a deepest portion of the continuous buried doped isolation region.

9. The die of claim 1 wherein
the first area is characterized as a rectangular area, wherein the first portion does not extend to the sidewall of the isolation ring structure in a location of a second corner area, a location of a third corner area, and a location of a fourth corner area of the first area;
the second corner area, the third corner area, and the fourth corner area are defined by the isolation ring structure;
a third portion of the continuous buried doped isolation region in the second corner area has a net first conductivity type dopant concentration lower than the first level;
a fourth portion of the continuous buried doped isolation region in the third corner area has a net first conductivity type dopant concentration lower than the first level;
a fifth portion of the continuous buried doped isolation region in the fourth corner area has a net first conductivity type dopant concentration lower than the first level.

* * * * *